United States Patent
Ylinen et al.

(10) Patent No.: US 8,015,529 B1
(45) Date of Patent: Sep. 6, 2011

(54) METHODS AND APPARATUS FOR DIAGONAL ROUTE SHIELDING

(75) Inventors: Judd M Ylinen, San Francisco, CA (US); Alexander Khainson, Morgan Hill, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 272 days.

(21) Appl. No.: 12/471,350

(22) Filed: May 22, 2009

Related U.S. Application Data

(62) Division of application No. 11/076,204, filed on Mar. 9, 2005, now Pat. No. 7,571,408.

(51) Int. Cl.
*G06F 17/50* (2006.01)

(52) U.S. Cl. ........ 716/115; 716/126; 716/129; 716/130; 716/131

(58) Field of Classification Search .......... 716/115, 716/126, 129, 130, 131
See application file for complete search history.

(56) References Cited

U.S. PATENT DOCUMENTS

| | | | |
|---|---|---|---|
| 5,300,798 A * | 4/1994 | Yamazaki et al. ............ 257/207 |
| 5,452,224 A | 9/1995 | Smith, Jr. et al. |
| 5,508,938 A | 4/1996 | Wheeler |
| 5,519,633 A | 5/1996 | Chang et al. |
| 5,657,242 A * | 8/1997 | Sekiyama et al. ............ 716/126 |
| 5,757,656 A | 5/1998 | Hershberger et al. |
| 5,789,770 A | 8/1998 | Rostoker et al. |
| 5,822,214 A | 10/1998 | Rostoker et al. |
| 5,994,766 A * | 11/1999 | Shenoy et al. ................ 257/659 |
| 6,215,495 B1 | 4/2001 | Grantham et al. |
| 6,250,968 B1 * | 6/2001 | Winings ........................ 439/676 |
| 6,256,769 B1 | 7/2001 | Tamarkin et al. |
| 6,262,487 B1 * | 7/2001 | Igarashi et al. ............... 257/758 |
| 6,301,686 B1 | 10/2001 | Kikuchi et al. |
| 6,317,864 B1 | 11/2001 | Kikuchi et al. |
| 6,385,758 B1 * | 5/2002 | Kikuchi et al. ............... 716/122 |
| 6,453,444 B1 | 9/2002 | Shepard |
| 6,483,714 B1 * | 11/2002 | Kabumoto et al. ........... 361/760 |
| 6,490,713 B2 | 12/2002 | Matsumoto |
| 6,553,555 B1 * | 4/2003 | Green et al. ................... 716/126 |

(Continued)

FOREIGN PATENT DOCUMENTS
WO   WO 2004/102339   11/2004

OTHER PUBLICATIONS
U.S. Appl. No. 11/178,256, filed Jul. 8, 2005, Kronmiller, Tom, et al.

(Continued)

*Primary Examiner* — Naum Levin
(74) *Attorney, Agent, or Firm* — Adeli & Tollen LLP

(57) ABSTRACT

An IC device and layout having one or more layers having route segments and at least some shield segments that are diagonal in orientation. Shield termination segments enclosing a route segment may be diagonal in orientation. Some embodiments describe a method for providing diagonal shielding for a routed net of an IC layout. A route "bloating" method is used where shield position lines (used to position the shielding) are generated by expanding out the dimensions of routes using a bloating shape. The bloating shape that may be dependent on the preferred wiring direction of the layer on which the shielding is provided. After bloating a route, a resulting bloating geometry is identified comprising the area overlapped during the expanding out of the route. The perimeter of the bloating geometry is identified comprising the shield position lines.

20 Claims, 12 Drawing Sheets

U.S. PATENT DOCUMENTS

| | | | |
|---|---|---|---|
| 6,609,237 | B1 | 8/2003 | Hamawaki et al. |
| 6,609,242 | B1 | 8/2003 | Slade |
| 6,618,846 | B2 * | 9/2003 | Cheng .......................... 716/115 |
| 6,629,302 | B2 | 9/2003 | Miura et al. |
| 6,645,842 | B2 * | 11/2003 | Igarashi et al. ............... 438/598 |
| 6,678,876 | B2 | 1/2004 | Stevens et al. |
| 6,701,306 | B1 | 3/2004 | Kronmiller et al. |
| 6,734,472 | B2 * | 5/2004 | Ho ................................ 257/207 |
| 6,763,508 | B2 | 7/2004 | Igarashi et al. |
| 6,779,167 | B2 | 8/2004 | Igarashi et al. |
| 6,797,999 | B2 | 9/2004 | Hou et al. |
| 6,802,048 | B2 | 10/2004 | Goto et al. |
| 6,813,756 | B2 | 11/2004 | Igarashi et al. |
| 6,879,934 | B1 | 4/2005 | Teig et al. |
| 6,912,704 | B1 | 6/2005 | Teig |
| 6,938,230 | B2 | 8/2005 | Frank et al. |
| 6,976,237 | B1 | 12/2005 | Teig et al. |
| 6,977,440 | B2 * | 12/2005 | Pflughaupt et al. ........... 257/777 |
| 6,988,162 | B2 * | 1/2006 | Goergen ....................... 710/317 |
| 6,996,793 | B1 | 2/2006 | Kronmiller et al. |
| 7,002,572 | B1 | 2/2006 | Teig et al. |
| 7,065,729 | B1 | 6/2006 | Chapman |
| 7,065,731 | B2 | 6/2006 | Jacques et al. |
| 7,080,339 | B2 | 7/2006 | Jacques et al. |
| 7,086,024 | B2 * | 8/2006 | Hsu et al. ...................... 257/787 |
| 7,117,470 | B1 * | 10/2006 | Teig et al. ..................... 716/126 |
| 7,137,097 | B1 * | 11/2006 | Aji et al. ....................... 716/129 |
| 7,174,529 | B1 | 2/2007 | Hetzel |
| 7,197,738 | B1 * | 3/2007 | Hetzel et al. .................. 716/126 |
| 7,243,328 | B2 | 7/2007 | Jacques et al. |
| 7,340,711 | B2 * | 3/2008 | Hetzel et al. .................. 716/130 |
| 7,472,366 | B1 | 12/2008 | Hetzel et al. |
| 7,480,885 | B2 | 1/2009 | Frankle et al. |
| 7,543,262 | B2 * | 6/2009 | Wang et al. ................... 716/119 |
| 7,571,408 | B1 | 8/2009 | Ylinen et al. |
| 7,644,384 | B2 * | 1/2010 | Teig et al. ..................... 716/126 |
| 7,694,258 | B1 | 4/2010 | Ylinen et al. |
| 7,721,243 | B2 | 5/2010 | Hetzel et al. |
| 7,730,441 | B2 | 6/2010 | Teig et al. |
| 7,737,722 | B2 * | 6/2010 | Rohe et al. ...................... 326/38 |
| 7,739,624 | B2 * | 6/2010 | McElvain et al. ............. 716/101 |
| 7,865,850 | B1 * | 1/2011 | Kao et al. ...................... 716/136 |
| 2002/0114224 | A1 * | 8/2002 | Sasaki et al. .................. 368/113 |
| 2003/0005399 | A1 | 1/2003 | Igarashi et al. |
| 2003/0009736 | A1 | 1/2003 | Suto |
| 2003/0051217 | A1 * | 3/2003 | Cheng .............................. 716/5 |
| 2003/0121017 | A1 | 6/2003 | Andreev et al. |
| 2003/0126582 | A1 | 7/2003 | Kobayashi et al. |
| 2003/0192019 | A1 | 10/2003 | Goto et al. |
| 2004/0049754 | A1 | 3/2004 | Liao et al. |
| 2004/0098688 | A1 | 5/2004 | Vuong et al. |
| 2004/0140862 | A1 * | 7/2004 | Brown et al. .................. 333/117 |
| 2004/0145033 | A1 * | 7/2004 | McElvain ...................... 257/659 |
| 2004/0178424 | A1 * | 9/2004 | Ho ................................. 257/207 |
| 2004/0210862 | A1 | 10/2004 | Igarashi et al. |
| 2004/0243960 | A1 * | 12/2004 | Hsu et al. .......................... 716/8 |
| 2005/0044520 | A1 | 2/2005 | Vuong et al. |
| 2005/0098895 | A1 | 5/2005 | Hung |
| 2005/0172247 | A1 | 8/2005 | Papadopoulou et al. |
| 2005/0223348 | A1 | 10/2005 | Frank et al. |
| 2005/0235246 | A1 | 10/2005 | Smith et al. |
| 2005/0273744 | A1 | 12/2005 | Allen et al. |
| 2005/0273748 | A1 * | 12/2005 | Hetzel et al. .................... 716/14 |
| 2009/0077522 | A1 | 3/2009 | Frankle et al. |
| 2009/0089735 | A1 | 4/2009 | Hetzel et al. |
| 2010/0096757 | A1 | 4/2010 | Teig et al. |

OTHER PUBLICATIONS

U.S. Appl. No. 12/731,057, filed Mar. 24, 2010, Ylinen, Judd Matthew., et al.

U.S. Appl. No. 12/772,967, filed May 3, 2010, Teig, Steven, et al.

Portions of Prosecution History of U.S. Appl. No. 11/195,334, Mailed Nov. 18, 2009, Ylinen, Judd M., et al.

Portions of Prosecution History of U.S. Appl. No. 11/076,204, Mailed Feb. 23, 2009, Ylinen, Judd M., et al.

Portions of Prosecution History of U.S. Appl. No. 10/684,211, Mailed Apr. 24, 2006, Teig, Steven, et al.

Portions of Prosecution History of U.S. Appl. No. 11/548,655, Mailed Jan. 11, 2010, Teig, Steven, et al.

Portions of Prosecution History of U.S. Appl. No. 11/464,478, Mailed Nov. 10, 2009, Teig, Steven, et al.

Portions of Prosecution History of U.S. Appl. No. 10/443,811, Mailed Mar. 1, 2006, Jacques, Etienne, et al.

Portions of Prosecution History of U.S. Appl. No. 10/751,332, Mailed Nov. 9, 2006, Hetzel, Asmus, et al.

Portions of Prosecution History of U.S. Appl. No. 11/673,429, Mailed Mar. 15, 2010, Hetzel, Asmus, et al.

International Search Report for PCT/US04/14380, Jan. 24, 2005 (mailing date), Cadence Design Systems, Inc.

Written Opinion for PCT/US04/14380, Jan. 24, 2005 (mailing date), Cadence Design Systems, Inc.

International Preliminary Report on Patentability for PCT/US04/14380, Jul. 11, 2005 (mailing date), Cadence Design Systems, Inc.

"Polygonal Expansion Algorithm," IBM Technical Disclosure Bulletin, TDB-ACC-No. NB8911253, Nov. 1, 1989, pp. 253-264, vol. No. 32, Issue No. 6B, US.

* cited by examiner

| 5th Layer: -45 Diagonal |
| 4th Layer: +45 Diagonal |
| 2rd Layer: Horizontal |
| 2nd Layer: Vertical |
| 1st Layer: Horizontal |

METHODS AND APPARATUS FOR DIAGONAL ROUTE SHIELDING

CLAIM OF BENEFIT TO PRIOR APPLICATION

This application is a divisional application of U.S. patent application Ser. No. 11/076,204, now issued as U.S. Pat. No. 7,571,408, filed on Mar. 9, 2005, which is incorporated herein by reference.

FIELD OF THE INVENTION

The present invention is directed towards methods and apparatus for diagonal route shielding.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers.

One example of a PD wiring model is the PD Manhattan wiring model, which specifies alternating layers of preferred-direction horizontal and vertical wiring. An example of a newer PD wiring model is the PD diagonal wiring model, which specifies alternating layers of preferred-direction diagonal wiring. The PD diagonal wiring model can allow for shorter wiring distances than the PD Manhattan wiring model and can decrease the total wirelength needed to interconnect the electronic and circuit components of an IC.

Design engineers design IC's by transforming logical or circuit descriptions of the IC's components into geometric descriptions, called layouts. An IC layout comprises descriptions of each layer of the IC and typically include a variety of geometries such as (1) circuit modules (i.e., geometric representations of electronic or circuit IC components) with pins, and (2) interconnect lines (i.e., geometric representations of wiring) that connect the pins of the circuit modules. A net is typically defined as a collection of routable elements (e.g., pins) that need to be connected.

To create layouts, design engineers typically use electronic design automation ("EDA") applications. These applications provide sets of computer-based tools for creating, editing, and analyzing IC design layouts. One EDA tool is a router that defines routes for interconnect lines that connect the routable elements (e.g., pins) of nets. In routing the routable elements of a net, a router may explore Manhattan routing directions, and more recently, diagonal routing directions on a layer of an IC to determine routes for connecting the routable elements. The various geometries of the IC layout are later physically created for an IC based on the descriptions of the various geometries in the IC layout.

SUMMARY OF THE INVENTION

Some embodiments provide an IC device and IC layout having one or more layers having route segments and shield segments for the route segments, where at least some of the shield segments are diagonal in orientation. In some embodiments, shield termination segments that enclose a route segment at an endpoint of the route segment are diagonal in orientation.

Some embodiments provide a method of providing shielding for route segments (interconnect lines/wires) in a region of an integrated circuit ("IC") layout, wherein at least some of the route segments are diagonal route segments. In some embodiments, after routes for a net are defined, separate shielding geometries are added to the layout that are adjacent to at least some diagonal route segments defined for the net. In some embodiments, the shielding geometries are diagonal in orientation and run substantially parallel with the diagonal route segment it shields.

In some embodiments, a route "bloating" method is used to provide shielding for routes of a routed net. In these embodiments, shield position lines (used to position/align the shielding) are generated by bloating (extending/expanding out) routes of the net using a bloating shape. In some embodiments, the bloating shape is dependent on the preferred direction of the layer for which the shielding is provided.

Once a bloating shape is determined, the bloating shape is used to extend/expand out the route segment from one endpoint of the route segment to the other endpoint. A resulting bloating geometry is then identified, the bloating geometry comprising the entirety of the area on the layout that is overlapped by the expanding/extending out of the route segment by the bloating shape. Conceptually, the resulting bloating geometry comprises the area overlapped by the bloating shape if the bloating shape is placed on one endpoint of the route segment and moved along the route segment to the other endpoint of the route segment. The perimeter of the bloating geometry is then identified, the perimeter comprising the shield position lines that are used to position the shielding. In some embodiments, shield termination segments that enclose a route segment at an endpoint of the route segment are diagonal in orientation.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 1:
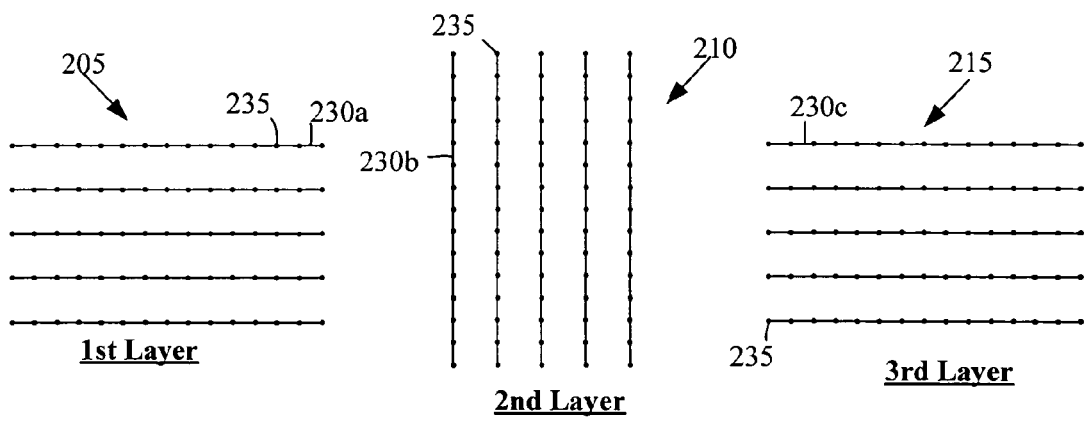
FIG. 1 illustrates a five-layer wiring model.

I: Terms and Concepts:

In an IC layout, a router defines routes to connect routable elements of nets. Routable elements in the IC-layout include, for example, pins, previously defined interconnect lines, via pads, etc. In some embodiments, the router uses a five-layer wiring model that is illustrated in FIG. 1. As shown in this figure, this wiring model has horizontal wiring on wiring layer 1, vertical wiring on wiring layer 2, horizontal wiring on wiring layer 3, +45° diagonal wiring on wiring layer 4, and −45° diagonal wiring on wiring layer 5. One of ordinary skill will realize that the router can use other wiring models in other embodiments.

In some embodiments, an object (e.g., interconnect line/route, shielding, shield position line, sides of a bounding polygon, etc.) is "horizontal" or "vertical" in orientation if it forms an angle of 0° or 90° with respect to one of the Cartesian coordinate axes of the layout, which are typically parallel with the layout's boundary and/or the boundary of the layout's expected IC. On the other hand, an object (e.g., interconnect line/route, shielding, shield position line, sides of a bounding polygon, etc.) is "diagonal" in orientation if it forms an angle other than 0° or 90° with respect to the layout's coordinate axes or boundary and/or the boundary of the layout's expected IC. For instance, in some embodiments, a 45° diagonal line is one that is at a 45° orientation (in the counterclockwise direction) with respect to the layout's x-axis or boundary, while a −45° diagonal line is one that is at a −45° orientation (in the counterclockwise direction) with respect to the layout's x-axis or boundary.

In the embodiments below, the horizontal, vertical, and ±45° routing directions are available on each wiring layer (although each layer has one preferred routing direction). The four routing directions on each layer provide eight possible directions (called segment directions) for a route to traverse from any point on a layer. These segment directions are 0°, 45°, 90°, 135°, 180°, 225°, 270°, and 315°. As used herein, a route segment is a portion of a route or the entirety of a route.

Figure 2:
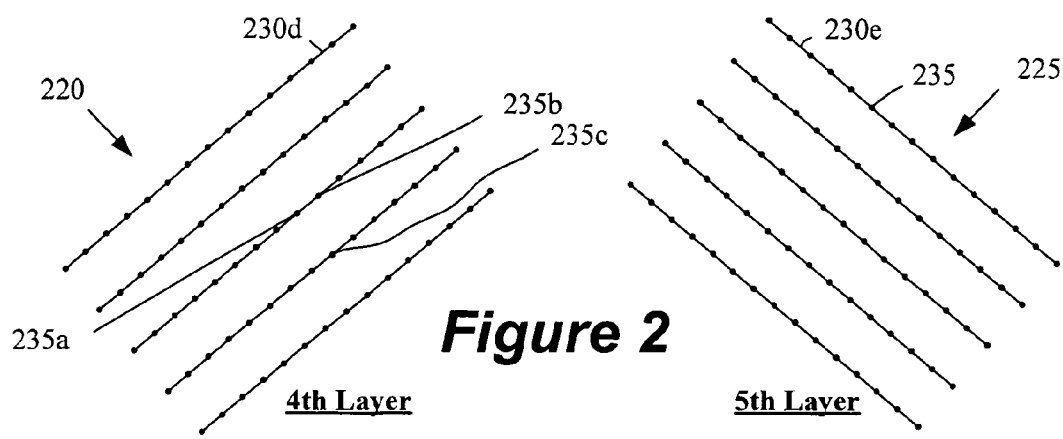
FIG. 2 illustrates five routing grids for the five-layer wiring model of FIG. 1.

In some embodiments, to define routes for an IC layout, a routing graph is first defined that includes a routing grid for each routing layer. As illustrated in FIG. 1, each routing layer has a preferred routing direction in some embodiments. In some of these embodiments, each routing grid of each particular routing layer includes numerous routing tracks that are in direction of the preferred routing/wiring direction of the particular routing layer. For instance, FIG. 2 illustrates five routing grids 205-225 for the five-layer wiring model of FIG. 1. Each of these routing grids includes numerous tracks 230 that are in the preferred routing direction of their layer. For example, the routing grid 220 for the fourth layer has numerous tracks 230d that are in the +45° preferred routing direction of the fourth layer in the five-layer model of FIG. 1.

As used herein, an object (e.g., route, shielding, shield position line, sides of a bounding polygon, etc.) on a layer of the layout is said to be "on grid" when the endpoints and bend points of the object are positioned on a routing track and not between routing tracks. Bend points of an object are points on the object where the object changes direction or orientation in relation to the layout's coordinate axes. The routing tracks are defined in the route grid of the layer based on the preferred routing direction of the layer.

Each track is formed by numerous edges that connect numerous grid points 235 along the track. The router is said to be a "gridded" router when the grid points in the routing graph (i.e., the grid points in all the routing grids) do not include all the grid points of the manufacturing grid, which is the grid used by the IC manufacturing process. On the other hand, the router is said to be "gridless" when its routable states (e.g., its grid points, nodes, lines, surfaces, etc.) are not aligned with any arbitrary routing grid. The routable states of a gridless router are typically aligned with the grid of the manufacturing process (i.e., typically each point on the manufacturing grid is a routable state in one of the routing grids), so that the final layout can be easily manufactured. However, in certain instances, the gridless routers might not even be aligned with the manufacturing grid. In some cases, the gridless routers are aligned with a grid that is even finer (i.e., has a higher resolution) than the manufacturing grid.

The grid points along the tracks serve as the start, intermediate, termination, and bend points of routes. After a router selects a start and target geometry for routing, a path search is performed to identify a route between the start and target geometries. The path search identifies a path from a start geometry to a target geometry by iteratively identifying path expansions along the grid, where each expansion is from a start grid point to a destination grid point that define a potential route segment. On a particular layer, a route segment can go from a first grid point on a first track to a second adjacent grid point on a second track (i.e., a route can have a segment that traverses the particular layer in a direction that is not the preferred direction of the particular layer). A route may also traverse multiple layers. Such a route is a multi-layer route. A multi-layer route uses at least one non-planar route segment (i.e., via) to traverse from one layer to another.

A layout design often has to comport with a variety of design rules that specify, for example, minimum length or spacing requirements for route segments. As such, the router must conform to the specified design rules in creating routes for a net. The design rules must be met when creating shielding for the net as well (as discussed below). After a net is routed and shielded, a design rule check (DRC) is performed to determine any design rule violations in the layout. A DRC violation occurs when a layout design violates such a design rule. As sometimes referred to herein, a "legal" layout or net is a layout or net that comprises routes and shielding that comports with design rules.

To assist in providing legal routing and shielding, the routing grid of a layout holds a record thus far of the geometries on the layout and include, for example, information/data regarding the position of the various geometries and whether particular routing tracks are occupied by a geometry or not. The routing grid is updated during routing and is used by the router to determine which tracks are still available and can be "legally" routed upon.

Each IC layout also contains a power grid structure that provides power and ground to each electronic and circuit component of an IC. Each electronic or circuit IC component has a power pin and a ground pin that is connected (routed) to the power grid structure. A power net is typically defined as a collection of power pins that need to be connected and a ground net is typically defined as a collection of ground pins that need to be connected. The power grid structure is described in the IC layout and is later physically created for use in an IC based on the descriptions in the IC layout.

Power grid structure components include stripes, rails, and vias. Stripes are typically positioned across one or more layers of the IC and provide power and ground to the IC. Rails are typically positioned across one or more layers of the IC where each rail is connected to either a power stripe or a ground stripe through a via. Vias are positioned perpendicular to the IC's layers and distribute power or ground from the stripes to the rails.

II: Shielding for Diagonal Route Segments

In some embodiments, after a net is routed (i.e., routes for connecting the routable elements of the net are defined), the net is then shielded where at least some route segments of the net are shielded (i.e., provided shield segments placed adjacent to the route segments). As sometimes referred to herein, a routed net comprises a net and a plurality of routes connecting the routable elements of the net, a route having one or more connected route segments. As sometimes referred to herein, a shielded net comprises a routed net and shielding adjacent to at least some portions of the route segments of the routed net, a shield having one or more connected shield segments. In some embodiments, at least some of the route segments of the routed net are diagonal in orientation. In some embodiments, at least some of the shield segments of the net are diagonal in orientation.

Shielding of a route segment is advantageous in that it can help insulate the route segment from cross-talk and interference from neighboring signals on neighboring route segments. In some embodiments, shielding comprises metal wiring (having a predetermined width). However, unlike routes, shielding is not used to electrically connect routable elements of a net.

A: General Method of Routing and Shielding

Figure 3:
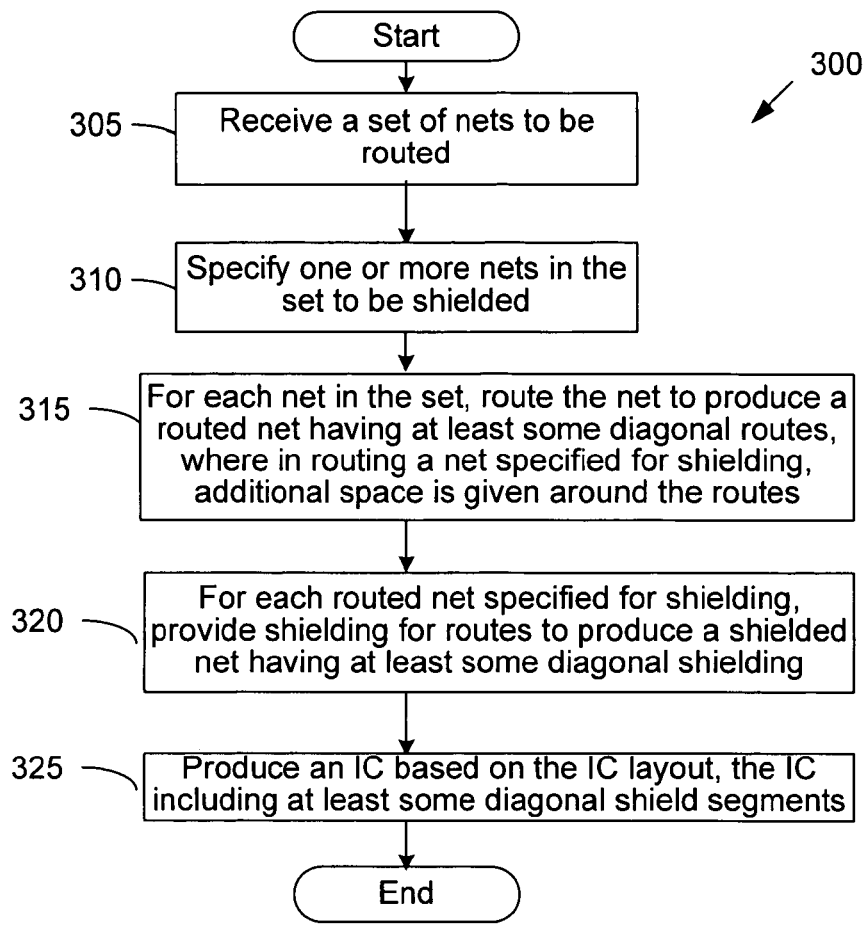
FIG. 3 is a flow chart of a general method for routing and shielding nets of an IC layout.

FIG. 3 is a flow chart of a general method 300 for routing and shielding nets of an IC layout and producing an IC based on the IC layout. In some embodiments, the method 300 is implemented by software or hardware configured to route and shield nets. In some embodiments, some steps of the method 300 are performed by a router.

The method 300 begins when it receives (at 305) a set of nets to be routed in an IC layout comprising a variety of geometries (representing, for example, circuit modules, pins, interconnect lines, etc.). Each net in the set comprises a set of routable elements (e.g., pins) to be connected. In some embodiments, the routable elements of a net may be on different layers of the layout. The method then specifies/identifies (at 310) one or more nets in the set that are also to be shielded. The method may do so, for example, by receiving identifications of the one or more nets to be shielded from a user.

For each net in the set of nets, the method then routes (at 315) the net to produce wire/route geometries comprising routes connecting routable elements of the net. Routes of a net may traverse multiple layers through vias. In some embodiments, all routes of a routed net are "on grid." In some embodiments, a routed net comprises at least some route segment geometries that are diagonal in orientation. In some embodiments, in routing a net that is specified/identified for shielding, the method leaves additional space (i.e., more space than for nets not identified for shielding) around defined route geometries so as to leave adjacent routing tracks unoccupied (to allow open space in which shielding can later be inserted).

For each routed net specified for shielding, the method then provides (at 320) shield geometries adjacent to at least some route geometries of the routed net to produce a shielded net.

In some embodiments, a shielded net comprises at least some shield segment geometries that are diagonal in orientation. In some embodiments, shield geometries run substantially parallel to route geometries at any given segment of a route geometry. As sometimes referred to herein, a shield geometry associated with a particular route geometry is a shield geometry that is placed adjacent to the route geometry for shielding the route geometry. Step 320 is described below in further detail in relation to FIG. 4.

The method then produces (at 325) an IC based on the IC layout generated in steps 305 to 320, the IC having at least some diagonal shield segments on one or more layers of the IC. The IC layout comprises a variety of geometries (including shield geometries) that represent, for example, circuit modules, pins, interconnect lines/wires, shielding, etc., that are physically created for the IC based on the descriptions of the various geometries in the IC layout. The method uses methods known in the art to produce the IC based on the IC layout. The method 300 then ends.

There are three phases for providing shielding for a routed net: (1) idealized shielding is generated about routes of the routed net, (2) the idealized shielding is typically modified to produce "legal" shielding that comports with specified design rules, and (3) the "legal" shielding is connected to the power grid structure of the layout (to either power (VDD) or ground (VSS) as appropriate).

Figure 4:
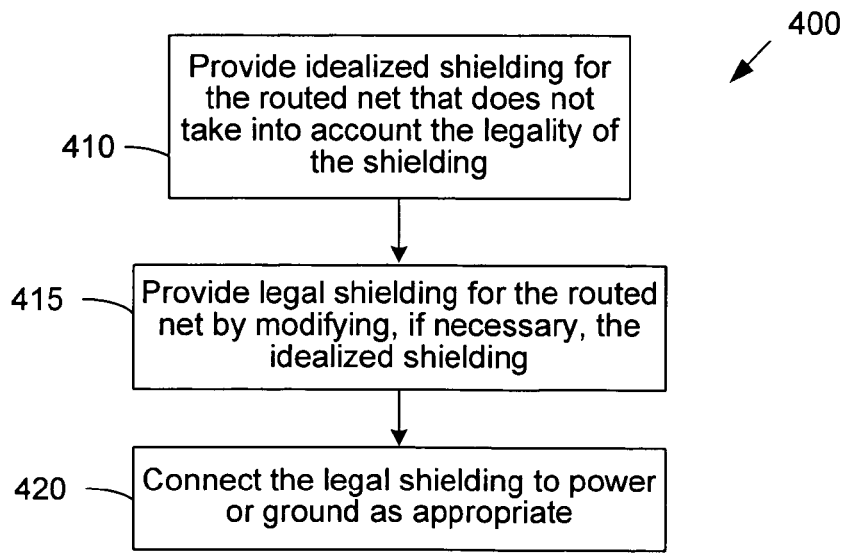
FIG. 4 is a flow chart of a method for shielding a routed net of an IC layout.

FIG. 4 is a flow chart of a method 400 for shielding a routed net of an IC layout. In some embodiments, the method 400 is implemented by software or hardware configured to shield nets. In some embodiments, the method 400 is performed by a router. In some embodiments, the method 400 comprises step 320 of the general method 300.

The routed net to be shielded comprises a set of routes (route geometries). The method provides (at 410) idealized shielding (shield geometries) for the routed net. Idealized shielding for the routed net does not take into account other geometries on the layout or the legality of the shielding in terms of the other geometries and specified design rules. In some embodiments, idealized shielding for the routed net is produced using a route "bloating" method. Step 410 is described below in further detail in relation to FIG. 5. The method then provides (at 415) "legal" shielding for the routed net (that comports to specified design rules) by modifying, if necessary, the idealized shielding for the routed net. In some embodiments, "legal" shielding for the routed net is produced by performing legal queries to a route grid to check the legality of shield segments. Step 415 is described below in further detail in relation to FIG. 7.

The method then connects (at 420) the "legal" shielding (shield geometries) to the power grid structure of the layout (to either power (VDD) or ground (VSS) as appropriate). In some embodiments, the "legal" shielding is connected to power or ground using a router. Step 420 is described below in further detail in relation to FIG. 10. The method 400 then ends.

B: Method for Providing Idealized Shielding

In some embodiments, a route "bloating" method is used to provide idealized shielding for a routed net. In these embodiments, shield position lines (used to position/align the shield geometries) are generated by bloating (extending/expanding out) routes of the net using a bloating shape. In some embodiments, the bloating shape is dependent on the preferred direction of the layer for which the shielding is provided.

Once a bloating shape is determined, the bloating shape is used to extend/expand out the route segment from one endpoint of the route segment to the other endpoint. A resulting bloating geometry is then identified, the bloating geometry comprising the entirety of the area on the layout that is expanded/extended out by the bloating shape. Conceptually, the resulting bloating geometry comprises the area overlapped by the bloating shape if the bloating shape is placed on one endpoint of the route segment and moved along the route segment to the other endpoint of the route segment. The perimeter of the bloating geometry is then identified, the perimeter comprising the shield position lines that are used to position the shielding.

Figure 5:
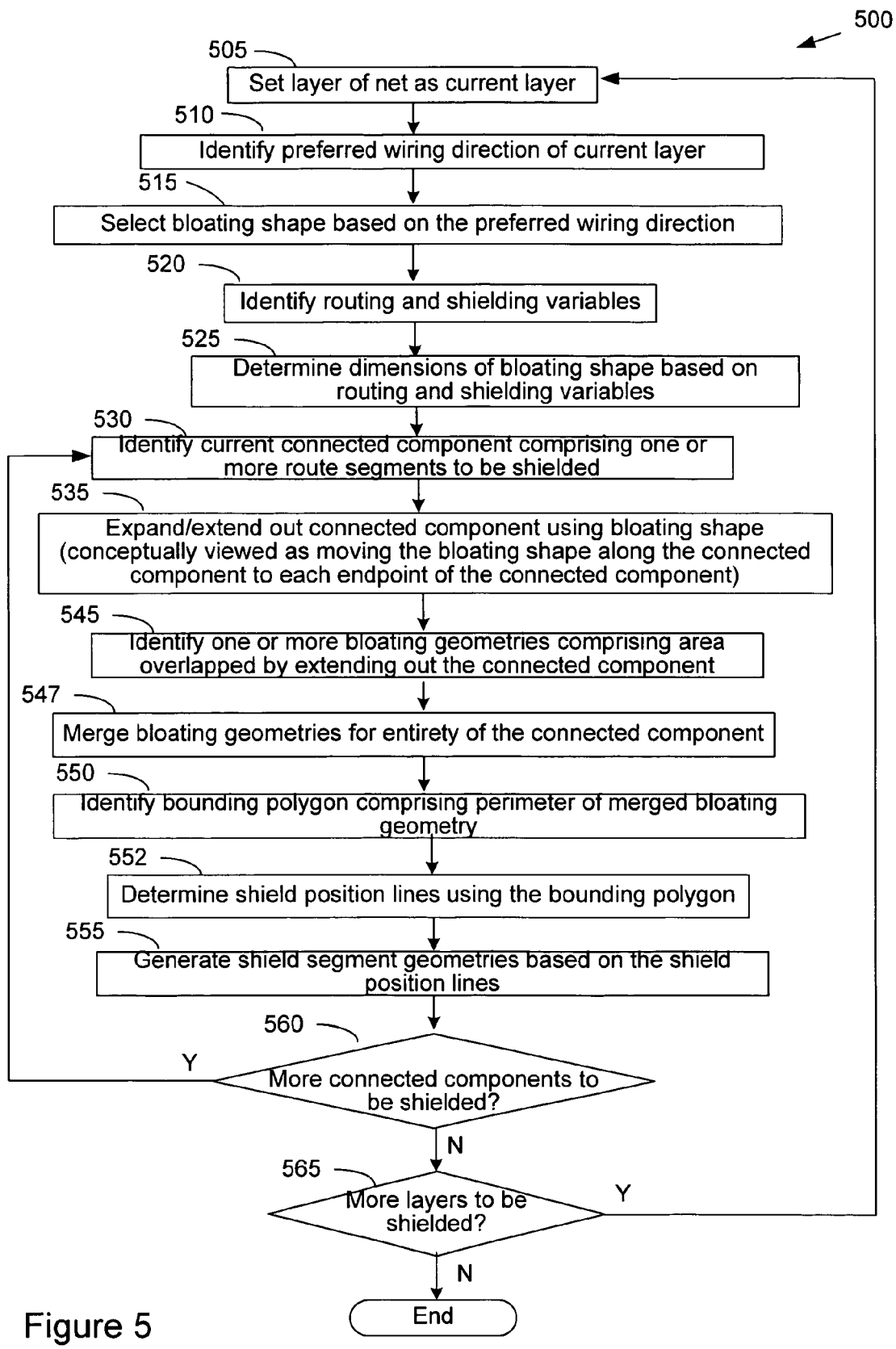
FIG. 5 is a flow chart of an idealized shielding method for providing idealized shielding for a routed net of an IC layout.

FIG. 5 is a flow chart of a method 500 for providing idealized shielding for a routed net of an IC layout. In some embodiments, the method 500 comprises step 410 of the method 400. In some embodiments, the routed net comprises at least some route segment geometries that are diagonal in orientation. The method 500 is described in relation to FIGS. 6A-C which illustrates examples of the operations of the idealized shielding method 500. In some embodiments, the routed net traverses multiple layers of the layout (i.e., one or more routes of the routed net traverse multiple layers of the layout), each layer having a particular preferred wiring direction (e.g., Manhattan or diagonal).

For a routed net that traverses multiple layers, the method 500 separately provides idealized shielding for each layer of the routed net. As such, the method begins by setting (at 505) a layer of the net as a current layer for shielding, the current layer comprising a set of routes, each route comprising a set of one or more route segments. The method then identifies (at 510) the preferred wiring direction of the current layer (e.g., Manhattan or diagonal). The method selects (at 515) a bloating shape based on the preferred wiring direction of the current layer. In some embodiments, for a layer having a Manhattan preferred wiring direction, the method selects a square bloating shape in relation to the layout coordinate axes. As used herein, a square bloating shape has sides that form an angle of 0° or 90° with respect to one of the boundaries or coordinate axes of the layout (i.e., run parallel or perpendicular to one of the boundaries or coordinate axes of the layout).

In some embodiments, for a layer having a diagonal preferred wiring direction, the method selects a diamond bloating shape in relation to the layout coordinate axes. As used herein, a diamond bloating shape has sides that form an angle other than 0° or 90° (e.g., 45°) or −45° with respect to one of the boundaries or coordinate axes of the layout (i.e., do not run parallel or perpendicular to one of the boundaries or coordinate axes of the layout). As such, a diamond bloating shape can be viewed as a square bloating shape that has been rotated 45 degrees.

As such, in some embodiments, a square bloating shape is used to generate position lines for shielding on layers having a Manhattan preferred wiring direction and a diamond bloating shape is used to generate position lines for shielding on layers having a diagonal preferred wiring direction. If the routes of the routed net are "on grid," the choice of bloating shape based on the preferred wiring direction helps ensure that the shield position lines resulting from the bloating shape are also "on grid" (as discussed below).

The method then identifies (at 520) particular routing and shielding variables including, for example, grid pitch (the spacing between routing tracks), route width (the default interconnect line width used in routing the net), shield spacing (the desired spacing between the routes of the net and the shielding to be added), shield width (the desired width of shielding), etc. The method may do so, for example, by receiving identifications of the routing and shielding variables from a user.

The method then determines (at 525) the dimensions of the bloating shape based on the routing and shielding variables. In some embodiments, if the bloating shape is a square or diamond shape, the method uses a predetermined equation to determine the dimensions. In some embodiments, the predetermined equation is expressed as:

$$\text{CEIL\_BY\_PITCH\_TIMES\_TWO}(\text{route width} + \text{shield width} + 2 \ast \text{shield spacing})$$

where CEIL_BY_PITCH_TIMES_TWO is a function that rounds up the input (i.e., the total of route width, shield width, and 2*shield spacing) to the next larger integer multiple of twice the grid pitch. As such, when the bloating shape is centered on a route segment that is "on grid," the sides of the bloating shape will be located on the nearest routing track that is at least [(route width+shield width)/2+shield spacing] distance away from the routing track occupied by the route segment. As such, the dimensions of the bloating shape are determined such that when the center-point of the bloating shape is placed on a route located on a routing track, the sides of the bloating shape are on adjacent routing tracks. Therefore, where route segments of the routed net are "on grid," the method 500 provides shielding that is also "on grid."

The method then identifies (at 530) a current connected component on the current layer to be shielded. As known in the art, a connected component comprises a set of one or more route segments that are connected. As used herein, a connected component is constructed per layer (i.e., on a single layer) and typically excludes vias. As described in the examples below, a connected component comprises a set of connected route segments. However, in its simplest form, a connected component comprises a single route segment. The operation of identifying connected components on a layer is well known in the art and thus not discussed in detail here.

An endpoint of a route segment in a connected component is either a "connected" endpoint or a "non-connected" endpoint. A "connected" endpoint is connected to an endpoint of another route segment in the connected component, whereas a "non-connected" endpoint is not connected to another endpoint of another route segment in the connected component (and is either connected to a via or a routable element, e.g., pin). A "non-connected" endpoint is sometimes referred to herein as a leaf endpoint. The leaf endpoints of the route segments of a connected component comprises the endpoints of the connected component, wherein a connected component can have two or more endpoints.

In some embodiments, the endpoints of the route segments of the current connected component are "on grid" so that they are located on a routing track. In some embodiments, the centerlines of the route segments of the current connected component are located on routing tracks when the route segments travel along the preferred wiring direction of the current layer. In some embodiments, the route segments of the current connected component travels in one or more wiring directions (e.g., travels in Manhattan and diagonal directions).

Figure 6A:
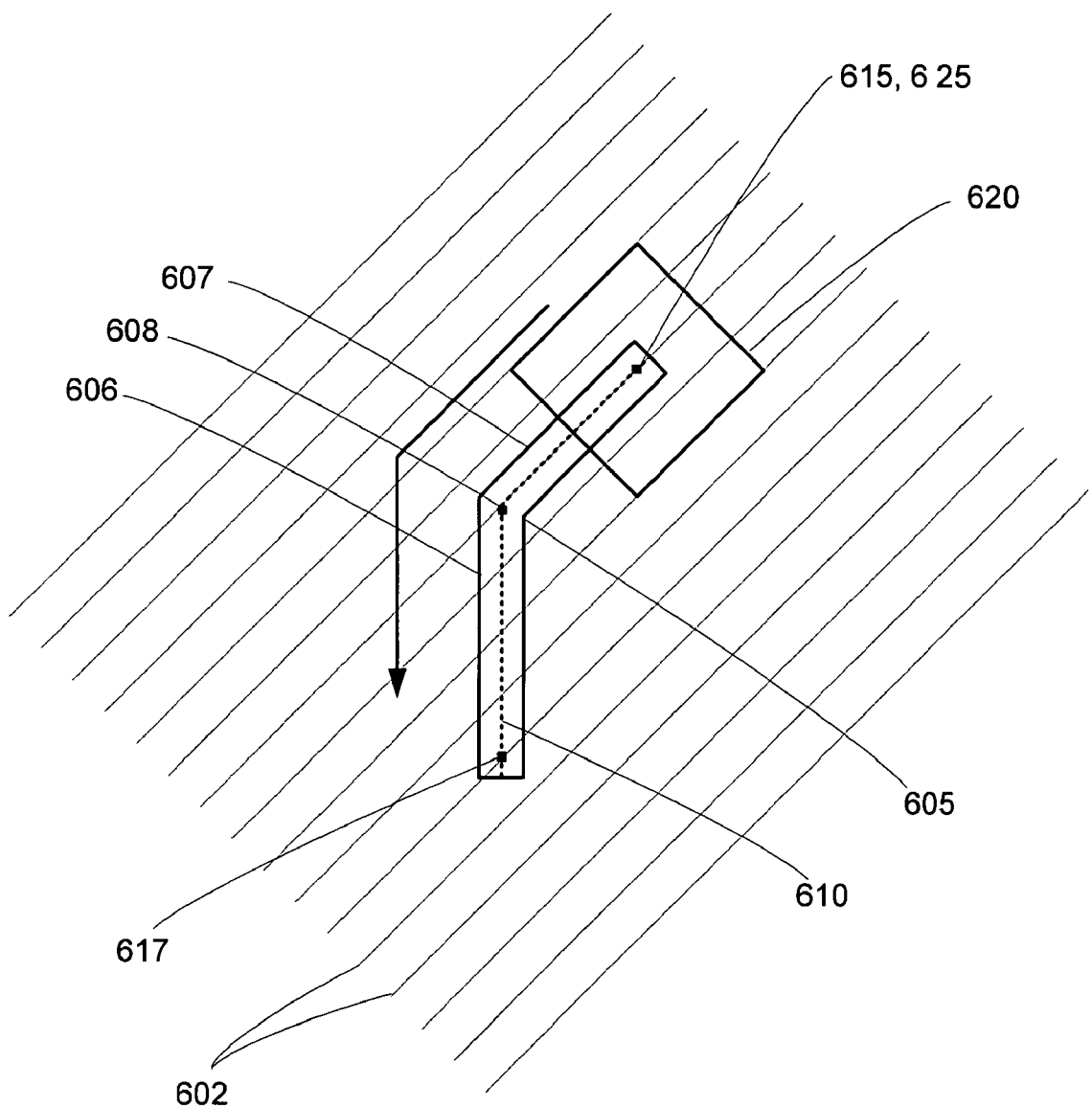
FIGS. 6A-C illustrates examples of the operations of the idealized shielding method of FIG. 5.

FIG. 6A shows an example of a region of an IC layout having diagonal routing tracks 602 and a connected component 605 having a centerline 610. The connected component 605 comprises a first route segment 606 that travels in a Manhattan direction and a second route segment 607 that travels in a diagonal direction. In the example of FIG. 6A, the first route segment 606 has a leaf endpoint 617 and a non-leaf endpoint 608 and the second route segment 607 has a leaf endpoint 615 and a non-leaf endpoint 608. Note that the endpoints of the first and second route segments are each on a routing track 602 (i.e., are "on grid"). The leaf endpoints 617 and 615 of the first and second route segments comprise endpoints of the connected component 605.

The method then bloats, i.e., extends/expands out (at 535) the dimensions of the current connected component throughout the length of the connected component (from each endpoint of the connected component) using the bloating shape. In some embodiments, the method places the center-point of the bloating shape on the centerline of connected component to bloat the connected component. Conceptually, this can be viewed as moving the bloating shape (having sides with a particular orientation in relation to the layout coordinate axes) along the connected component to each endpoint of the connected component while the sides of the bloating shape do not change orientation in relation to the layout coordinate axes (i.e., the sides of the bloating shape doe not rotate in relation to the center-point of the bloating shape). As shown in FIG. 6A, a center-point 625 of a diamond bloating shape 620 is placed on a first endpoint 615 of the connected component 605 and is conceptually moved along the centerline 610 of the connected component to a second endpoint 617 (as indicated by the arrow symbols).

The method then determines/identifies (at 545) one or more bloating geometries produced by expanding out the connected component with the bloating shape. The one or more bloating geometries comprise the entirety of the area on the layout that is overlapped by the expanding/extending out of the connected component by the bloating shape. Conceptually, the resulting bloating geometries comprise the area overlapped by the bloating shape if the bloating shape is moved along the connected component to each endpoint of the connected component. The method then merges (at 547) the one or more bloating geometries into a single continuous bloating geometry for the entire connected component.

Figure 6B:
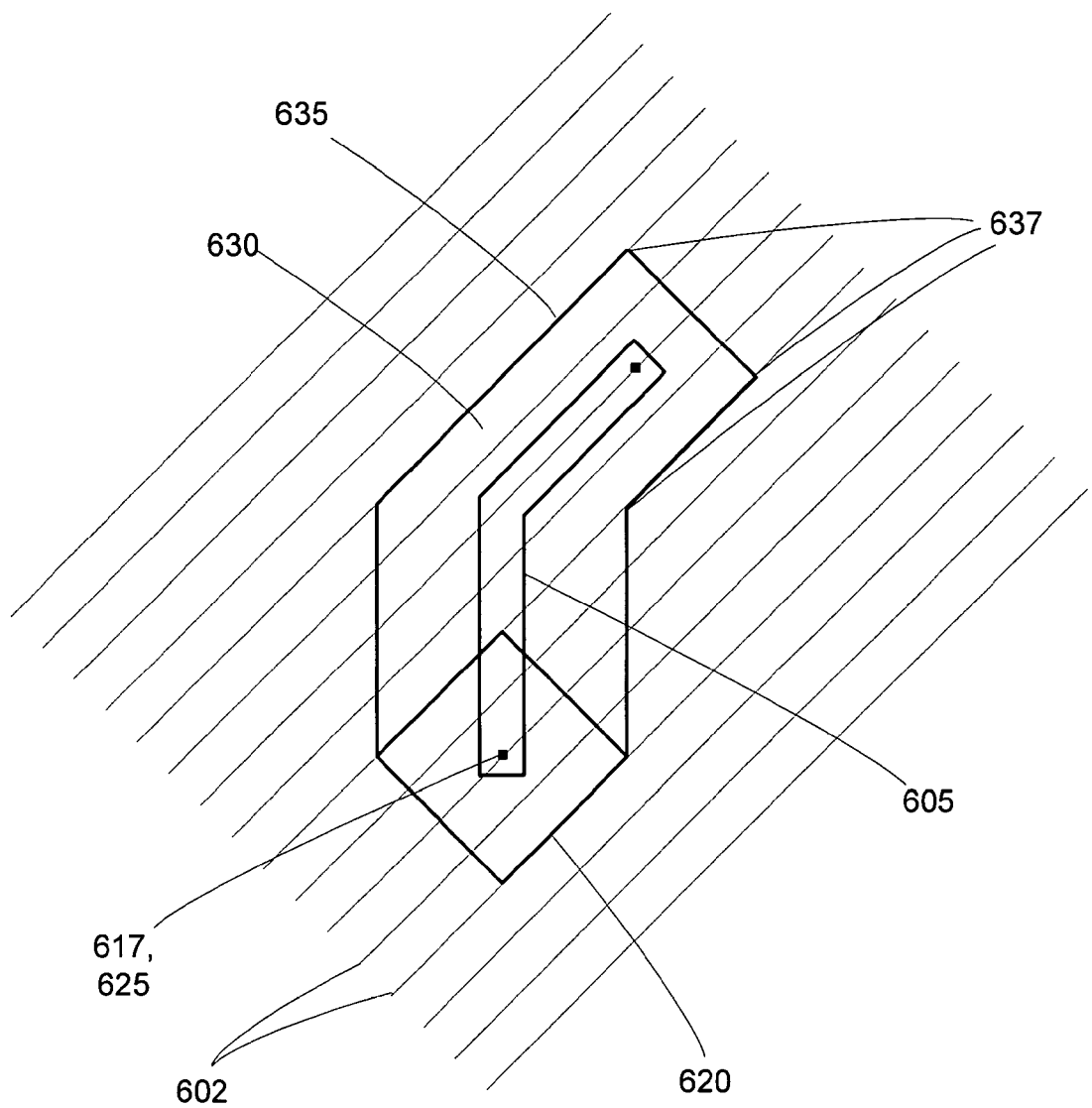

The method then determines/identifies (at 550) a bounding polygon comprising the perimeter/sides of the merged bloating geometry (i.e., the polygon that bounds the merged bloating geometry). In some embodiments, bend points of the bounding polygon are located on a routing track adjacent to the routing track on which the current route segment is located/positioned. As shown in FIG. 6B, a merged bloating geometry 630 comprises the area on the layout that the bloating shape 620 overlapped during the bloating operation. FIG. 6B also shows a bounding polygon 635 comprising the perimeter of the merged bloating geometry 630 having bend points 637 located on a routing track 602 adjacent to the routing track on which the connected component 605 is located.

The method then determines/identifies (at 552) shield position lines (used to position the shield geometries) using the bounding polygon. In some embodiments, the shield position lines comprise the bounding polygon. In other embodiments, the shield position lines comprise some but not all of the bounding polygon. In these embodiments, a subset of the bounding polygon is selected and used as shield position lines.

Figure 6C:
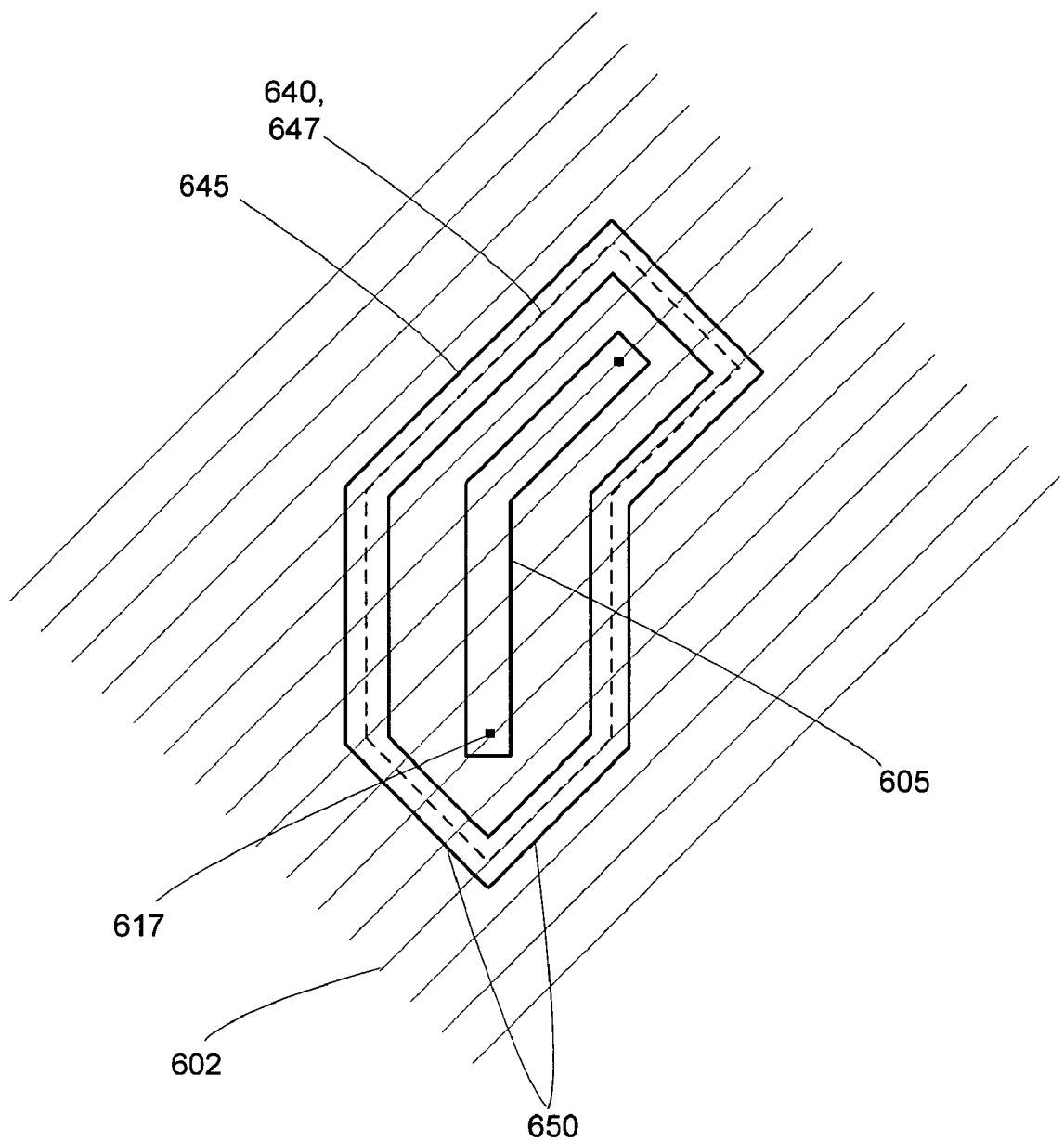

The method then generates (at 555) shield segment geometries based on the shield position lines, the width of the shield segment geometries being equal to the shield width (identified at step 525). In some embodiments, the shield position lines comprise centerlines of the shield segment geometries. As such, the centerlines of the shield segment geometries are approximately aligned with the shield position lines giving shield segment geometries that closely mirrors the current route segment. As shown in FIG. 6C, shield position lines 640 are used to position shield geometries 645. In the example of FIG. 6C, the centerlines 647 of the shield geometries 645 are approximately aligned with the shield position lines 640 giving shield segment geometries 645 that closely mirrors the connected component 605.

As discussed above, the leaf endpoints of the route segments of a connected component comprise the endpoints of the connected component (615 and 617 of FIG. 6A). While generating idealized shielding, the endpoints of a connected component are enclosed by shielding geometries. As used herein, the shield segment geometries that enclose a connected component at an endpoint of the connected component are referred to as a shield termination geometries. Typically, however, while modifying the idealized shielding to produce legal shielding for an IC layout (as discussed below in relation to FIG. 7), shield termination geometries that enclose an endpoint of a connected component that is connected to a routable element are removed (since the enclosed shielding would cause problems in connecting to the routable element and violate design rules). However, if the endpoint of the connected component is connected to a via, the shield termination geometries that enclose the endpoint may or may not be removed depending on whether the shield termination geometries violate any design rules.

In some embodiments, a shield termination geometry (diagonal shield termination geometry) forms an angle other than 0° or 90° (e.g., 45° or −45°) with respect to one of the boundaries or coordinate axes of the layout. FIG. 6C shows an example of diagonal shield termination geometries 650. FIG. 6C shows examples of shield segments that may be later produced on an IC.

The method then determines (at 560) whether there are more connected components on the current layer to be shielded. If so, the method continues at step 530 where a next current connected component on the current layer is identified for shielding. If not, the method proceeds to step 565 where it determines whether there are more layers of the routed net to be shielded. If so, the method continues at step 505 where a next layer of the routed net is set as the current layer for shielding. If not, the method 500 ends.

As described above in relation to FIG. 5, if routes of the routed net are "on grid," the choice of the bloating shape and the dimensions of the bloating shape (determined at steps 515 and 525) helps ensure that the shield position lines resulting from the bloating shape are also "on grid." For example, for a layer having a diagonal preferred wiring direction, if the center-point of the diamond bloating shape is positioned at an "on grid" point of the route segment, the four corners of the diamond bloating shape will be similarly "on grid" given the dimensions of the diamond bloating shape. As such, the bounding polygon resulting from sliding the diamond bloating shape along the route segment will also be "on grid."

As described above in relation to FIG. 5, the method 500 generates shield segment geometries at step 555. These shield segment geometries comprises the idealized shielding for a layer of the routed net and the idealized shielding for the routed net. In some embodiments, the routed net comprises at least some route segment geometries that are diagonal in orientation. The shielding method 500 of FIG. 5 provides shield segment geometries that closely mirrors the route segments. As such, in these embodiments, at least some of the shield segment geometries of the shielded net are diagonal in orientation.

C: Method for Providing Legal Shielding

Figure 7:
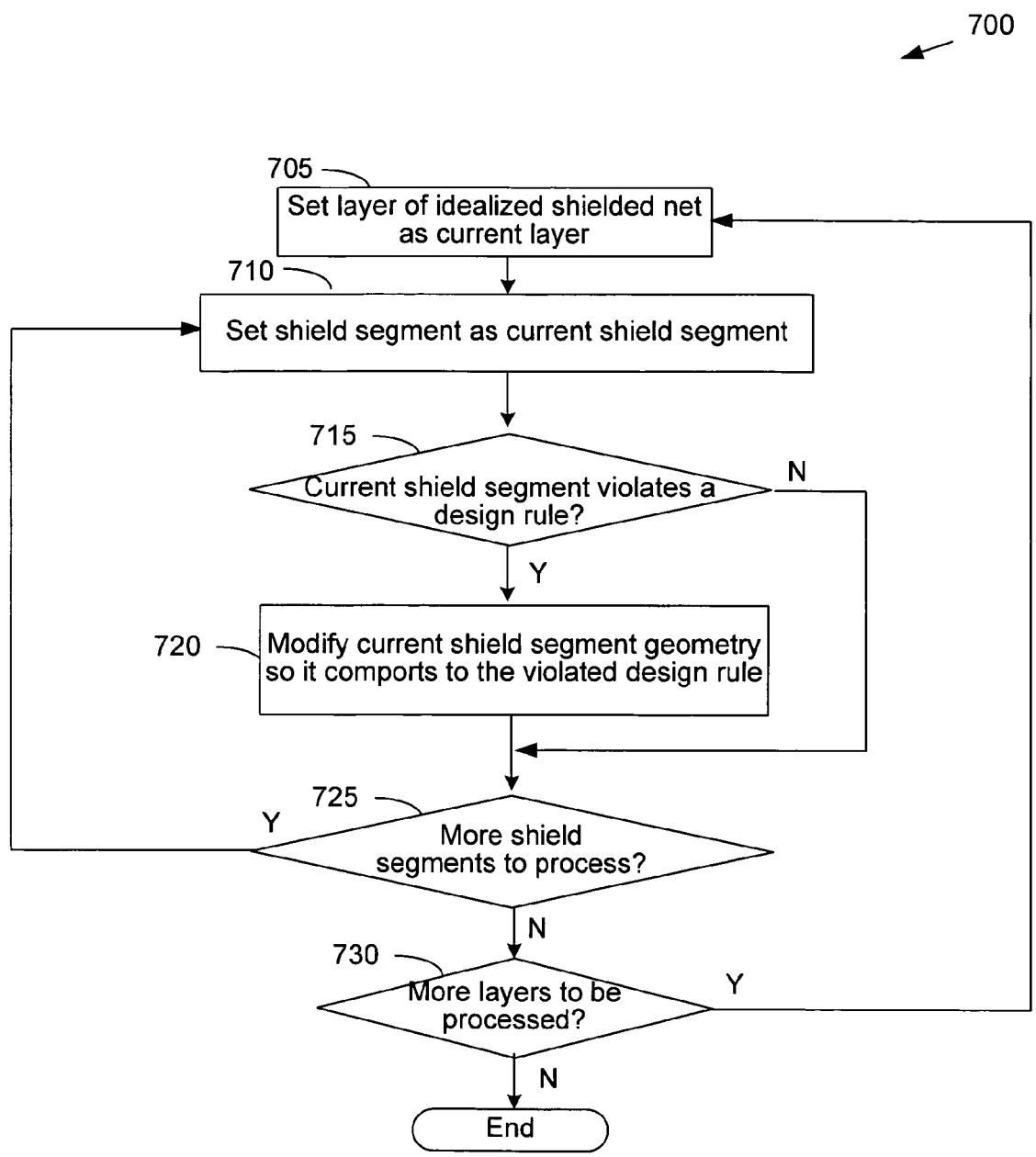
FIG. 7 is a flow chart of a legal shielding method for providing legal shielding for an idealized shielded net of an IC layout.

FIG. 7 is a flow chart of a method 700 for providing legal shielding for an idealized shielded net of an IC layout. In other embodiments, the method uses other methods for providing legal shielding as is known in the art. In some embodiments, the method 700 comprises step 415 of the method 400. In some embodiments, the method 700 modifies, if necessary, the idealized shielded net to comport with specified design rules. FIG. 7 is described in relation to FIGS. 8 and 9A-B which illustrate examples of operations of the legal shielding method 700.

The method begins by setting (at 705) a layer of the idealized shielded net as a current layer for processing, the current layer having an associated current routing grid that stores information/data regarding the various geometries on the current layer. The method then sets (at 710) a shield segment geometry of the current layer as a current shield segment geometry for processing. In some embodiments, the shield segment geometry is of a predetermined length or size.

The method then determines (at 715) whether the current shield segment geometry violates any specified design rules. The method may do so, for example, by performing a legal query to the current routing grid to check the legality of current shield segment geometry. For example, the method may determine that the current shield segment geometry overlaps or comes too close to another geometry already on the current layer, or breaks other design rules. In other embodiments, the method uses other methods known in the art. If the method determines (at 715) that the current shield segment geometry does not violate any specified design rules, the method continues at step 725.

If the method determines (at 715) that the current shield segment geometry does violate a design rule, the method modifies (at 720) the current shield segment geometry so that it comports to the violated design rule. For example, if the current shield segment geometry overlaps or is too close to another geometry, the method may reduce or take away parts of the current shield segment geometry that overlap or are too close to the other geometry. The shield segment geometry resulting from the modification is referred to as the maximum legal subset of the current shield segment geometry that can be added to the current layer.

Figure 8:
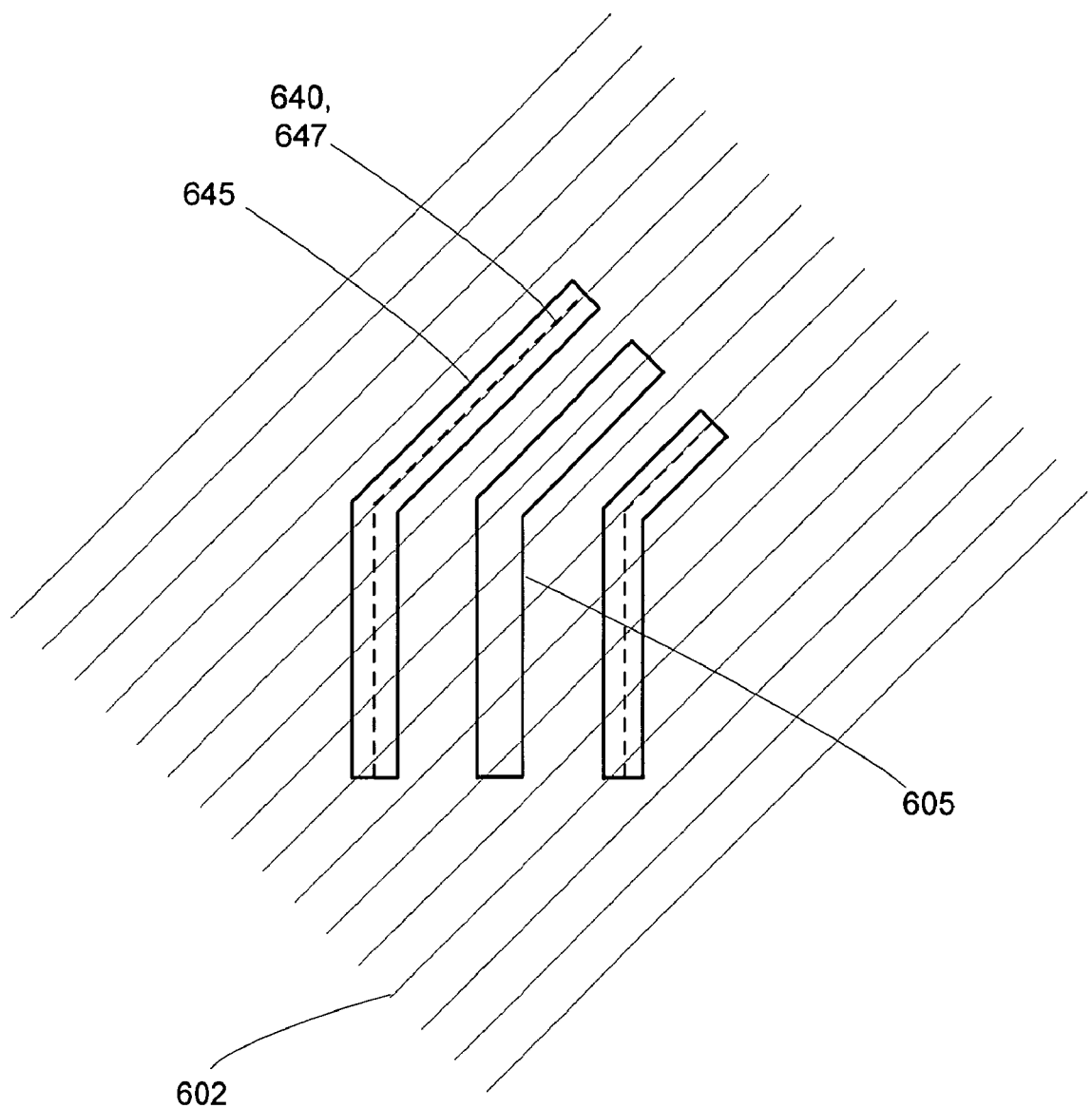
FIG. 8 illustrates an example of the operations of the legal shielding method of FIG. 7.

FIG. 8 shows an example of a legalized segment geometry of the idealized shield segment geometry of FIG. 6C. In the example shown in FIG. 8, the endpoints of the connected component 605 of FIG. 6C are connected to routable elements. As such the shield termination geometries that enclose the endpoints are removed (as illustrated in FIG. 8) since the enclosed shielding around the endpoints would cause problems in connecting to the routable element and violate design rules.

Figure 9A:
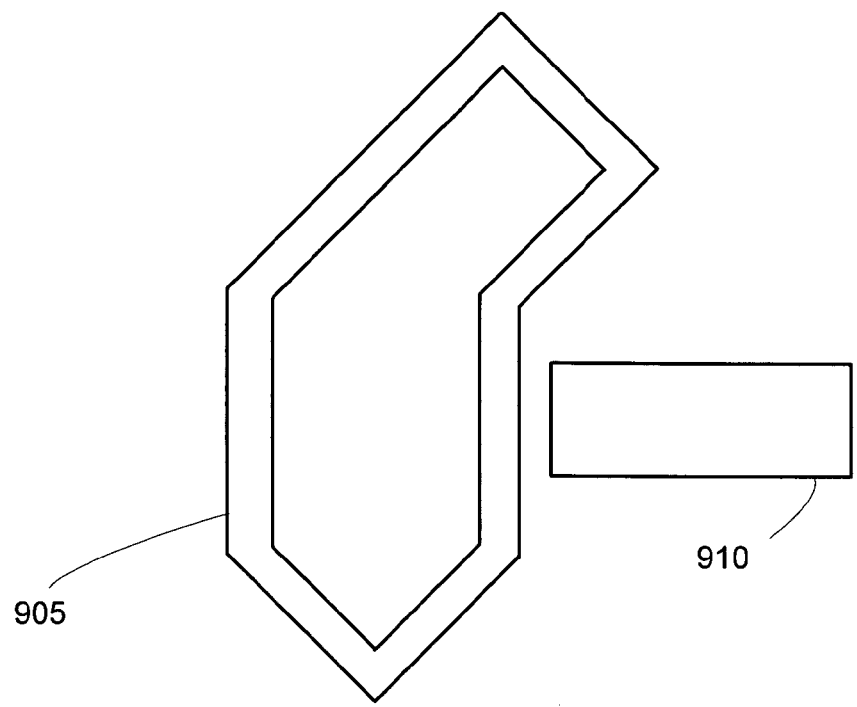
FIGS. 9A-B illustrates further examples of operations of the legal shielding method of FIG. 7.
Figure 9B:
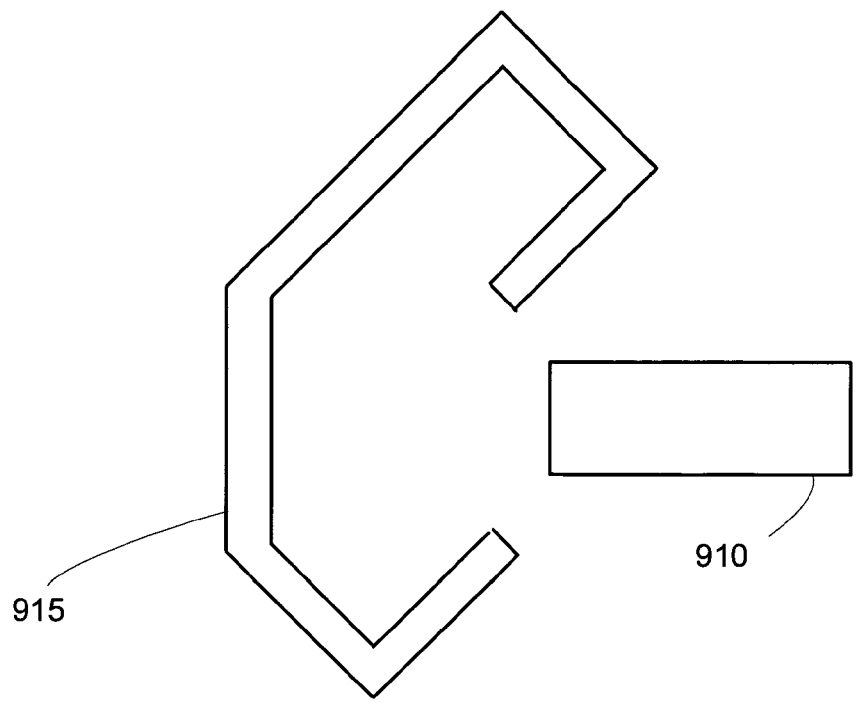

FIG. 9A shows an example of a region of an IC layout having an idealized shield segment geometry 905 that is too close to another geometry 910 on a layer. The idealized shield segment geometry 905 is then reduced to produce a modified shield segment geometry 915 that comports with specified design rules, as shown in FIG. 9B. FIG. 9B shows an example of shield segments that may be later produced on an IC.

The method then determines (at 725) whether there are more shield segment geometries of the current layer to process. If so, the method continues at step 710 where it sets a next shield segment geometry as a current shield segment geometry for processing. If not, the method proceeds to step 730 where it determines whether there are more layers of the idealized shielded net to be processed. If so, the method continues at step 705 where a next layer is set as the current layer for processing. If not, the method 700 ends. As described above in relation to FIG. 7, the method 700 generates a legal shielded net that comprises the maximum legal subset of the idealized shielded net that can be added to the routed net.

D: Method for Connecting Shielding to Power or Ground

Figure 10:
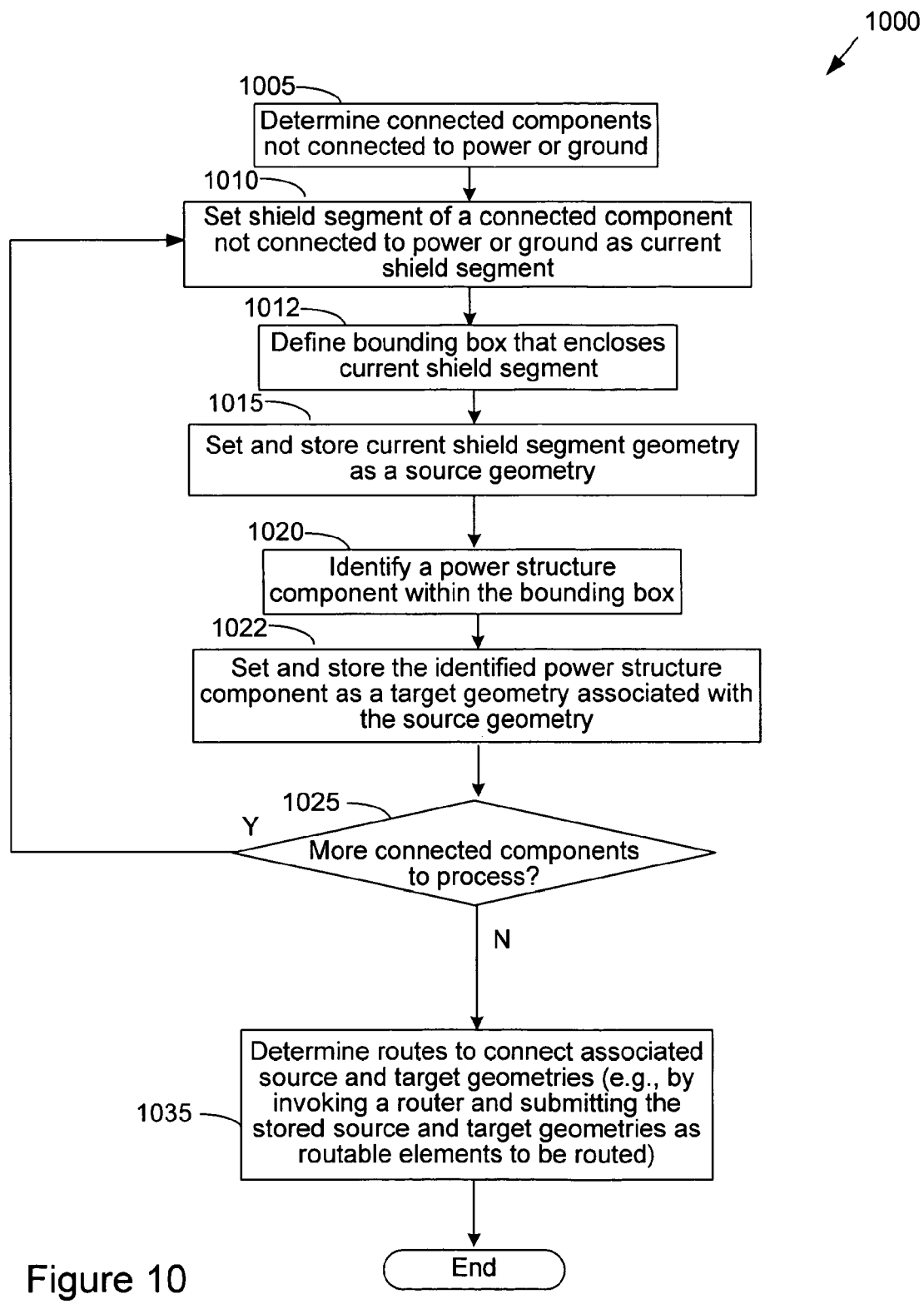
FIG. 10 is a flow chart of a method for connecting the legal shielded net of an IC layout to power or ground.

FIG. 10 is a flow chart of a method 1000 for connecting the legal shielded net of an IC layout to power or ground as appropriate. In other embodiments, the method uses other methods for connecting the legal shielding to power or ground, as known in the art. Connecting the shielding geometries to power or ground, as appropriate, helps insulate the routes from cross talk and interference from neighboring signals. In some embodiments, the method 1000 comprises step 420 of the method 400. FIG. 10 is described in relation to FIG. 11 which illustrates examples of operations of the method 1000.

The method begins by identifying (at 1005) all connected components throughout the layers of the IC layout that are not connected to power or ground. The layers of IC layout have power structure comprising components (e.g., stripes, rails, or vias) that provide power or ground to various components of the IC. The method then sets (at 1010) a shield segment geometry of a connected component not connected to power or ground as a current shield segment geometry for processing. In some embodiments, the shield segment geometry is of a predetermined length or size. The method then defines (at 1012) a bounding box that encloses the current shield segment geometry. In some embodiments, the bounding box has a predetermined size.

Figure 11:
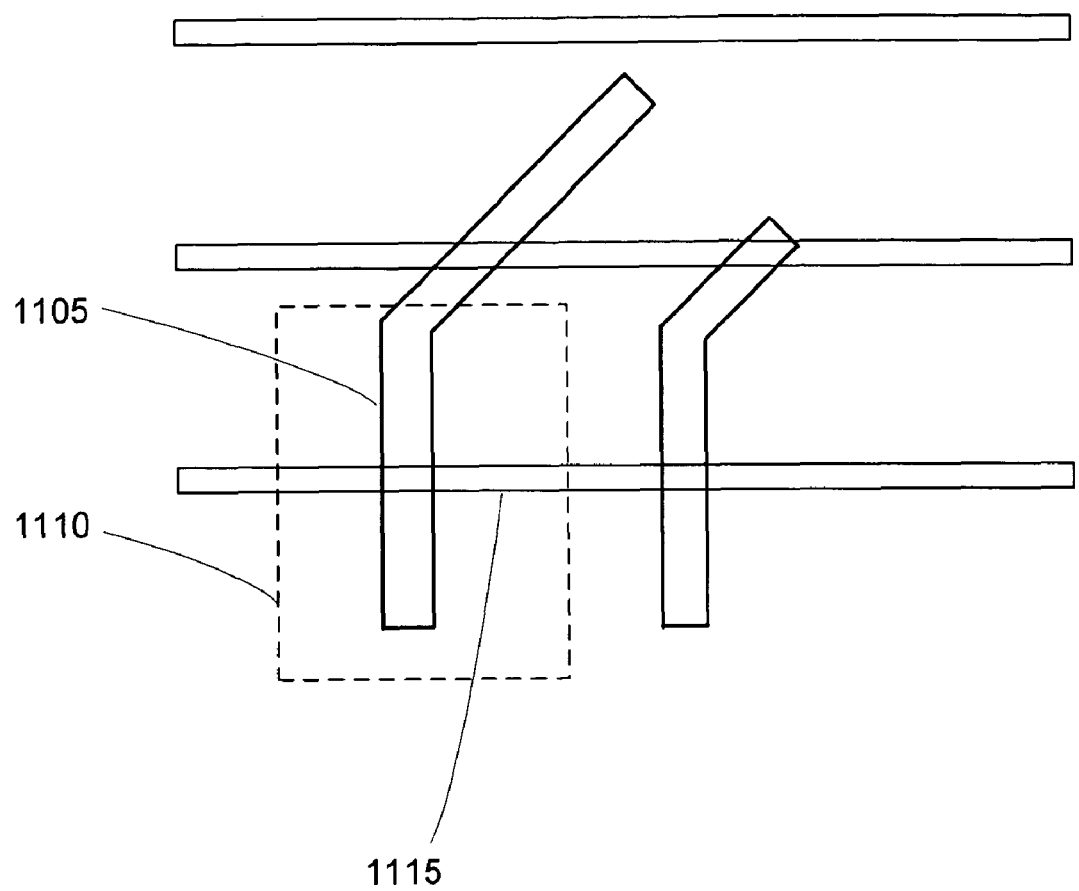
FIG. 11 illustrates examples of operations of the method of FIG. 10.

The method then sets and stores (at 1015) the current shield segment geometry as a source geometry. The method then identifies (at 1020) a power structure component within the bounding box and sets and stores (at 1022) the component as a target geometry associated with the source geometry. In some embodiments, if the method can not identify a power structure component, the method expands the size of the bounding box until at least one power structure component can be identified within the bounding box. FIG. 11 shows an example of a region of an IC layout having a shield segment geometry 1105 (source geometry) enclosed by a bounding box 1110. FIG. 11 also shows a power structure component 1115 (target geometry) within the bounding box 1110.

The method then determines (at 1025) whether there are more connected components not connected to power or ground to process. If so, the method continues at step 1010 where it sets a next shield segment geometry of a connected component not connected to power or ground as a current shield segment geometry for processing. If not, the method 1000 determines (at 1035) routes to connect associated source and target geometries, thus connecting legal shield segment geometries to either power or ground as appropriate. The method may do so, for example, by invoking a router and submitting the stored source and target geometries to the router as routable elements to be routed. The method then ends.

Figure 12:
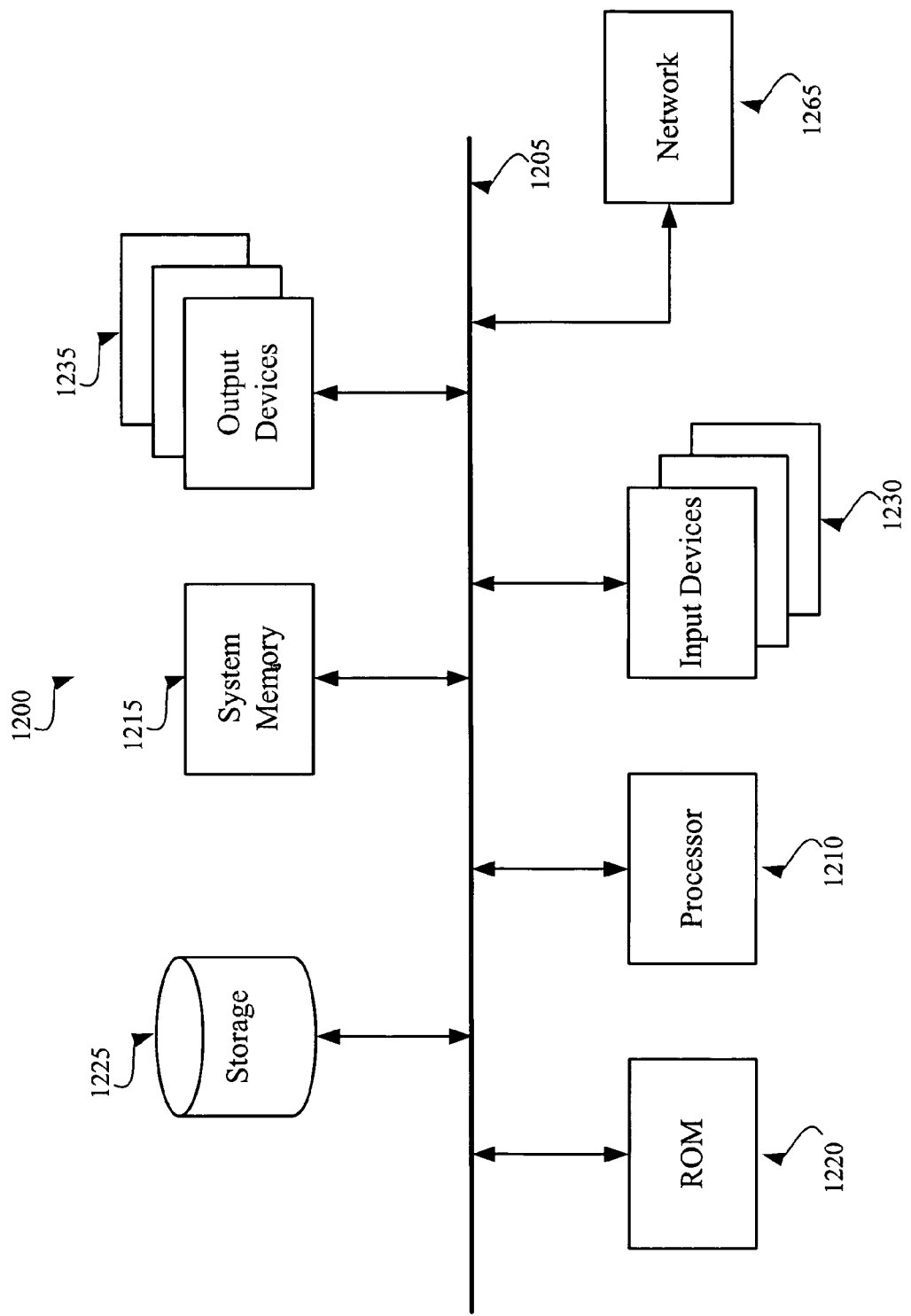
FIG. 12 conceptually illustrates a computer system with which one embodiment of the invention is implemented.

FIG. 12 presents a computer system 1200 with which some embodiments are implemented. The computer system 1200 includes a bus 1205, a processor 1210, a system memory 1215, a read-only memory 1220, a permanent storage device 1225, input devices 1230, and output devices 1235.

The bus 1205 collectively represents all system, peripheral, and chipset buses that communicatively connect the numerous internal devices of the computer system 1200. For instance, the bus 1205 communicatively connects the processor 1210 with the read-only memory 1220, the system memory 1215, and the permanent storage device 1225.

The read-only-memory (ROM) 1220 stores static data and instructions that are needed by the processor 1210 and other modules of the computer system. The permanent storage device 1225, on the other hand, is read-and-write memory device. This device is a non-volatile memory unit that stores instruction and data even when the computer system 1200 is off. Some embodiments use a mass-storage device (such as a magnetic or optical disk and its corresponding disk drive) as the permanent storage device 1225. Other embodiments use a removable storage device (such as a floppy disk or Zip® disk, and its corresponding disk drive) as the permanent storage device.

Like the permanent storage device 1225, the system memory 1215 is a read-and-write memory device. However, unlike storage device 1225, the system memory is a volatile read-and-write memory, such as a random access memory (RAM). The system memory stores some of the instructions and data that the processor needs at runtime.

Instructions and/or data needed to perform methods of some embodiments are stored in the system memory 1215, the permanent storage device 1225, the read-only memory 1220, or any combination of the three. For example, the various memory units may contain instructions for routing and shielding nets of an IC layout in accordance with some embodiments and/or contain video data. From these various memory units, the processor 1210 retrieves instructions to execute and data to process in order to execute the processes of some embodiments.

The bus 1205 also connects to the input and output devices 1230 and 1235. The input devices 1230 enable a user to communicate information and select commands to the computer system 1200. The input devices 1230 include alphanumeric keyboards and cursor-controllers. The output devices 1235 display images generated by the computer system 1200. The output devices include printers and display devices, such as cathode ray tubes (CRT) or liquid crystal displays (LCD).

Finally, as shown in FIG. 12, the bus 1205 also couples the computer system 1200 to a network 1265 through, for example, a network adapter (not shown). In this manner, the computer system 1200 can be a part of a network of computers (such as a local area network ("LAN"), a wide area network ("WAN"), or an Intranet) or a network of networks (such as the Internet). Any or all of the components of the computer system 1200 may be used in conjunction with some embodiments. However, one of ordinary skill in the art would appreciate that any other system configuration may also be used in conjunction with other embodiments.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. A method of designing an integrated circuit ("IC") layout, the IC layout comprising a plurality of layers, the IC layout comprising a plurality of nets, each net comprising a plurality of routable elements, the method comprising:
   using a computer for:
   identifying a particular net as a net to be shielded, said particular net having a set of associated route segments that connect the routable elements of the particular net; and
   defining shield segments adjacent to at least one of the route segments associated with the particular net, wherein at least one of the shield segments is oriented diagonally with respect to a boundary of the IC layout, at least one particular layer having a preferred routing direction, a particular shield segment on the particular layer of the IC layout having a direction that is different than the preferred routing direction of the particular layer, each shield segment representative of an IC shield segment formed by a conductive material that connects to a particular power state, wherein the conductive material shields a first wire segment on an IC from forming an electrical connection with a second wire segment on the IC, said first and second wire segments are based on first and second route segments.

2. The method of claim 1, wherein the shield segments run substantially parallel to associated route segments.

3. The method of claim 2, wherein a particular shield segment is associated with a particular route segment if the particular shield segment is defined adjacent to the particular route segment.

4. The method of claim 1, wherein the IC shield segments comprise wiring.

5. The method of claim 4, wherein the wiring comprises metal wiring.

6. The method of claim 1, wherein shield segments adjacent to a route insulate the route from interference from neighboring routes on the IC layout.

7. The method of claim 1, wherein the shield segments do not electrically connect the routable elements of the particular net.

8. A non-transitory computer readable medium storing a computer program which when executed by at least one processor designs an integrated circuit ("IC") layout, the IC layout comprising a plurality of nets, each net comprising a plurality of routable elements, the computer program comprising sets of instructions for:
   identifying a particular net as a net to be shielded;
   defining route segments to connect the routable elements of the particular net; and
   defining shield segments adjacent to at least one of the route segments, wherein at least one of the shield segments is oriented diagonally with respect to a boundary of the IC layout, wherein a set of shield segments on a particular layer of the IC layout encapsulates at least one particular route segment on said particular layer, each shield segment representative of an IC shield segment formed by a conductive material that connects to a particular power state, wherein the conductive material shields a first wire segment on an IC from forming an electrical connection with a second wire segment on the IC, said first and second wire segments are based on first and second route segments.

9. The non-transitory computer readable medium of claim 8, wherein the shield segments run substantially parallel to associated route segments.

10. The non-transitory computer readable medium of claim 9, wherein a particular shield segment is associated with a particular route segment if the particular shield segment is defined adjacent to the particular route segment.

11. The non-transitory computer readable medium of claim 8, wherein the IC shield segments comprise wiring.

12. The non-transitory computer readable medium of claim 11, wherein the wiring comprises metal wiring.

13. The non-transitory computer readable medium of claim 8, wherein shield segments adjacent to a route insulate the route from interference from neighboring routes on the IC layout.

14. The non-transitory computer readable medium of claim 8, wherein the shield segments do not electrically connect the routable elements of the particular net.

15. A system comprising:
   at least one processor for executing sets of instructions; and
   a memory that stores a computer program for designing an integrated circuit ("IC") layout, the IC layout comprising a plurality of nets, each net comprising a plurality of routable elements, the computer program comprising sets of instructions for:
   identifying a particular net as a net to be shielded;

defining route segments to connect the routable elements of the particular net; and defining shield segments adjacent to at least one of the route segments, wherein at least one of the shield segments is oriented diagonally with respect to a boundary of the IC layout, wherein a set of shield segments on a particular layer of the IC layout encapsulates at least one particular route segment on said particular layer, each shield segment representative of an IC shield segment formed by a conductive material that connects to a particular power state, wherein the conductive material shields a first wire segment on an IC from forming an electrical connection with a second wire segment on the IC, said first and second wire segments are based on first and second route segments.

16. The system of claim 15, wherein the shield segments run substantially parallel to associated route segments.

17. The system of claim 16, wherein a particular shield segment is associated with a particular route segment if the particular shield segment is defined adjacent to the particular route segment.

18. The system of claim 15, wherein the IC shield segments comprise wiring.

19. The system of claim 18, wherein the wiring comprises metal wiring.

20. The system of claim 15, wherein shield segments adjacent to a route insulate the route from interference from neighboring routes on the IC layout.

* * * * *